United States Patent [19]

Seward

[11] Patent Number: 4,485,360
[45] Date of Patent: Nov. 27, 1984

[54] APPARATUS FOR AND METHOD OF IMPEDANCE MATCHING

[75] Inventor: Glen Seward, Cincinnati, Ohio

[73] Assignee: Cincinnati Electronics Corporation, Cincinnati, Ohio

[21] Appl. No.: 398,852

[22] Filed: Jul. 16, 1982

[51] Int. Cl.³ .............................................. H03H 7/40
[52] U.S. Cl. .................................. 333/17 M; 333/109
[58] Field of Search ............ 333/17 M; 455/123, 124, 455/125

[56] References Cited

U.S. PATENT DOCUMENTS 2,838,658  6/1958  Vogel et al.
3,778,731  12/1973  Oomen
4,015,223  3/1977  Cheze .............................. 333/17 M
4,028,645  6/1977  Tressa ............................. 333/17 M
4,160,960  7/1979  Bikker
4,201,960  5/1980  Skutta et al. .................... 333/17 M Primary Examiner—Paul L. Gensler
Attorney, Agent, or Firm—Lowe, King, Price & Becker

[57] ABSTRACT

An rf load is matched to an rf source by a matching network having series and shunt impedances connected between the source and load. A network coupled to the load derives a first rf signal responsive to rf energy reflected from the load. Another network responsive to the first rf signal derives plural rf signals, each having an amplitude that is a different function of the magnitude and phase angle of the reflected energy. In response to the amplitudes of the plural rf signals, the values of the series and shunt impedances are controlled.

29 Claims, 3 Drawing Figures

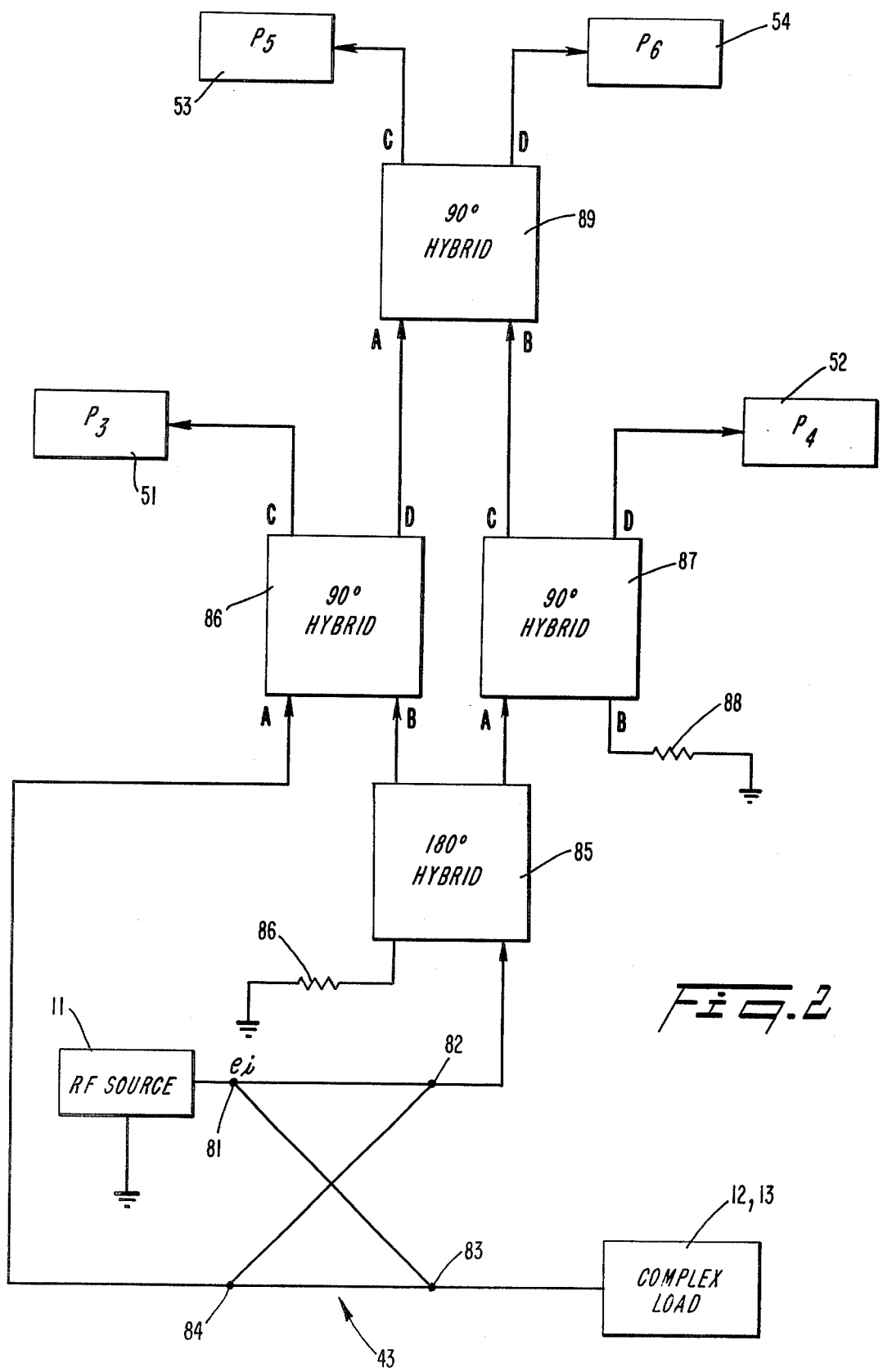

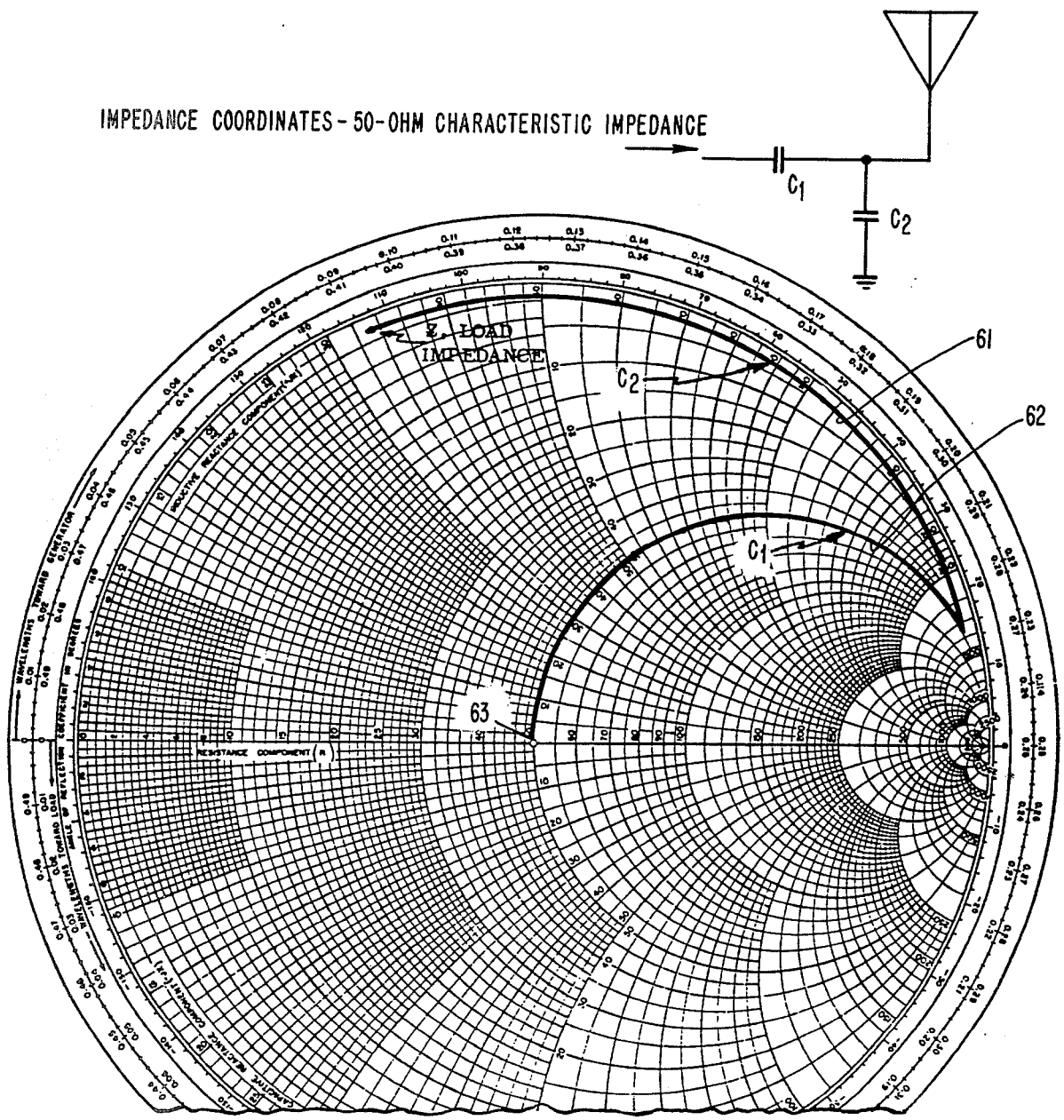
FIG. 3 - TUNING PATH OF TYPICAL SHORT INDUCTIVE ANTENNA

APPARATUS FOR AND METHOD OF IMPEDANCE MATCHING

FIELD OF THE INVENTION

The present invention relates generally to an apparatus for and method of controlling the matching of an rf load to an rf source and more particularly to such a method and apparatus wherein plural rf signals, each having an amplitude that is a different function of the magnitude and phase angle of reflected energy from the load, control the matching.

BACKGROUND OF THE INVENTION

Prior art devices for controlling the matching of an rf load to an rf source generally include detectors for various parameters of the load and/or relationships of differential characteristics between the source and load. Typical of these detectors are sensors for resistance, conductance, impedance magnitude, voltage standing wave ratio (VSWR) and differential phase between the source and load. Output signals from these detectors are supplied to a control network for impedances of a matching network between the rf source and rf load. Usually, the control network varies the values of the impedances, which in turn causes output signals from the detectors to vary or toggle about pre-establish levels therefor. There is thus derived an indication of whether the detected parameter, for a particular operating frequency of the source, is above or below the pre-established level. Matching is achieved when the detected parameters are at the pre-established levels.

While these prior art matching devices are generally satisfactory, they have certain disadvantages. In particular, the detectors employed in the prior art matching apparatus are frequently difficult to fabricate and adjust. If the rf source has wide power and frequency ranges, such as 30 dB and 2-30 megaHertz respectively, the cost and time to fabricate and adjust the detectors and coupling networks associated therewith are extensive. Because of these cost and time factors, the typical prior art device has a relatively limited rf dynamic power range. Each detector often requires several watts of transmitted rf power, which can be particularly deleterious for mobile, e.g., "manpack" applications. Each of the detectors employed with the prior matching devices usually has a specialized output signal, tailored to a particular application. The detectors associated with a particular matching apparatus often cannot be used if the impedance of the load being matched varies over a wide range of values.

It is, accordingly, an object of the present invention to provide a new and improved apparatus for and method of determining and controlling the match of an rf load to an rf source.

Another object of the invention is to provide a new and improved rf matching apparatus that is relatively easy to fabricate and adjust because the need for specialized detectors is obviated.

Still another object of the present invention is to provide a new and improved rf matching apparatus and method that can be employed over wide frequency and rf power levels.

Still a further object of the present invention is to provide an rf matching apparatus and method that can be employed for a load susceptible of varying over a wide range of values.

Still another object of the present invention is to provide a new and improved automatic rf matching apparatus wherein the need for separate detectors for individual parameters, such as load resistance, conductance, impedance magnitude, voltage standing wave ratio and phase difference between source and load, is obviated because plural signals representing the load complex reflection coefficient are derived.

DISCLOSURE OF THE INVENTION

In accordance with the present invention, series and shunt impedances of an rf matching network connected between an rf source and rf load are controlled in response to plural rf signals, each having an amplitude that is a different function of reflected load energy. To derive the plural rf signals, a network coupled to the matching network derives a first rf signal responsive to reflected energy from the load. Another network responds to the first rf signal to derive the plural rf signals, each having an amplitude that is a different function of the magnitude and phase angle of the load complex reflection coefficient. The values of the series and shunt impedances are controlled in response to the amplitudes of the plural rf signals. The amplitudes of the plural rf signals are determined with identical, conventional, broad band prior art power detecting networks, thereby obviating the need for specialized, frequency dependent detectors for load impedance parameters and the difference in characteristics between the source and load.

In a preferred embodiment, the network for coupling energy between the source and load derives first and second rf signals respectively responsive to rf energy from the source and rf energy reflected from the load. Another network responds to the first and second rf signals to derive four rf signals. Three of the four rf signals have amplitudes that are different functions of the magnitude and phase angle of the reflected energy, as well as of the rf source amplitude. The other of the four rf signals has an amplitude that is a function only of the rf source amplitude.

In the preferred embodiment, the values of the impedances are automatically controlled by, inter alia, a microprocessor based computer. The microprocessor based computer normalizes the amplitudes of the three rf signals relative to the amplitude of the other rf signal. The value of one of the matching network impedances is controlled in accordance with a first predetermined function of the three normalized rf signal amplitudes, and the value of another of the matching impedances is controlled in accordance with a second predetermined function of the three normalized rf signal amplitudes.

In the preferred embodiment, the matching network includes series and shunt reactances. The microprocessor based computer varies the value of one of the reactances until a predetermined approximate first relationship exists between the three normalized rf signal amplitudes while maintaining the value of the other reactance constant. The value of the other reactance is then varied until a predetermined, approximate second relationship exists between the three normalized rf signal amplitudes while the value of the one reactance remains constant at the value determined by the first relationship. In one situation, wherein the load is an antenna having an inductive reactance, the series and shunt reactances are both capacitances. If the load has other impedance characteristics, e.g. is a capacitive probe antenna, the matching network includes a series inductor and shunt capacitor.

In the preferred embodiment, the another network is a six port hybrid network including three substantially identical ninety degree hybrids and a one hundred eightly degree hybrid, which effectively functions as a power divider. The four rf signals are derived from four output ports of three of the hybrids.

The remaining two ports of the six port network are responsive to the rf energy from the source and reflected from the load. Because the hybrids are capable of operating over a wide frequency band, such as 2–30 megaHertz, the four rf output signals of the six port network are relatively insensitive to frequency variations within the band.

Energy is coupled to the six port network from the rf source and the load impedance by way of a first branch including a directional coupler during normal, full power operation while the source is driving the load. Because the directional coupler inserts significant loss in the signals supplied to the six port network it has very little effect on power coupled between the source and load; typically, the loss is at least 20 dB, and is preferably 30 dB. During initial calibration and matching, prior to normal operation, the six port network is responsive to power derived from a second branch including a hybrid coupler, in turn responsive to an attenuator connected between the rf source and the coupler. The attenuator and directional coupler, as well as a 180° hybrid, provide the same attenuation between the rf source and the inputs to the six port network. Thereby, the six port network is responsive to the same power levels, regardless of whether the system is in the full power or initial calibration and matching mode of operation. Selective insertion of these two branches is in response to signals derived from the microprocessor.

To provide calibration the microprocessor also controls switches connected between the two parallel branches and the matching network. In the preferred embodiment, three such switches are provided. One of the switches selectively connects one of the two parallel branches to the matching network; a second switch connects the energy coupled through the first switch to the matching network or to a calibrated matched impedance for the source which provides a calibrated reflection coefficient of $\Gamma=0$; the third switch selectively provides a calibrated reflection coefficient of $\Gamma=1$, $\phi=0$ by open circuiting the load for the source and a calibrated reflection coefficient of $\Gamma=1$, $\phi=180°$ by short circuiting the load for the source.

The system is calibrated each time the frequency of the source changes because the six port network, while having a broad band width, has variable output vs frequency characteristics over the band of the source. The amplitude of the six port outputs for $\Gamma=1$, $\phi=0$ and $\Gamma=0$ are compared with theoretical amplitudes to enable calibration coefficients to be derived for measured on-line outputs of the six port while the matching impedances are being controlled. The shunt impedance is controlled as a function of the calibration coefficients derived while $\Gamma=1$, $\phi=0$, while the series impedance is controlled as a function of the calibration coefficients while $\Gamma=0$.

It is, accordingly, still another object of the invention to provide a new and improved microprocessor controlled impedance matching network for an rf load driven by an rf source.

A further object is to provide a method of impedance matching with a system that is calibrated for different frequencies in a quasi on-line manner.

The above and still further objects, features and advantages of the present invention will become apparent upon consideration of the following detailed description of one specific embodiment thereof, especially when taken in conjunction with the accompanying drawings.

BRIEF DESCRIPTION OF THE DRAWING

FIG. 2 is a six-port network employed in the matching network of FIG. 1; and

FIG. 3 is a Smith diagram which assists in understanding the operation of the circuit of FIG. 1.

DETAILED DESCRIPTION OF THE INVENTION

Figure 1:
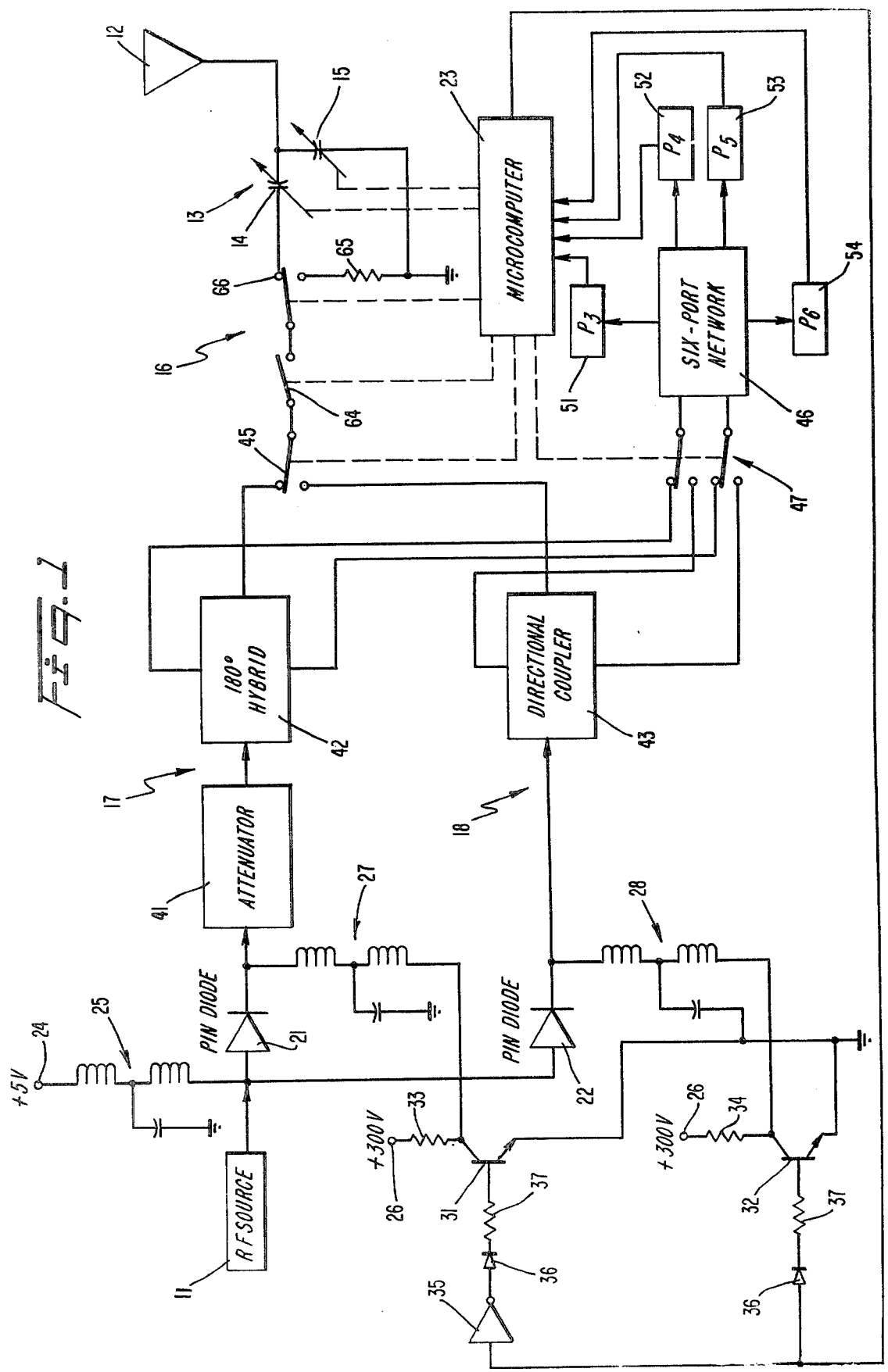
FIG. 1 is a block diagram of a preferred embodiment of the present invention.

Reference is now made to FIG. 1 of the drawing wherein the matching apparatus of the present invention is illustrated in combination with rf source 11, typically a high frequency or very high frequency (i.e., 2–30 megaHertz or 30–300 megaHertz) transmitter having a 50 ohm resistive output impedance, and rf load in the form of antenna 12, ideally also having a resistive impedance of 50 ohms and zero reactance. In actuality, however, antenna 12 has a tendency to vary from the idealized condition, so that the total impedance thereof may include substantial real and reactive components and differ considerably from 50 ohms. This tendency is due to various factors, such as loading of the antenna under various circumstances and impedance variations thereof over the frequency range of source 11. Source 11 can be considered as having a 50 ohm resistive output impedance over the entire frequency range of interest. The matching apparatus illustrated in the remainder of FIG. 1 provides an impedance match, as close as possible, between the 50 ohm resistive output impedance of rf source 11 and the actual impedance of antenna 12.

Matching between source 11 and load 12 is achieved by matching network 13, including series, variable capacitor 14, and shunt, variable capacitor 15, connected directly across antenna 12. Preferably, each of capacitors 14 and 15 is of a type disclosed in U.S. Pat. No. 3,509,500 to McNair et al., commonly assigned with the present invention. Such a variable capacitor includes a plurality of fixed capacitive elements, each having a relay contact shunting it. The fixed capacitive elements have predetermined values related to each other in accordance with a binary variation, whereby the largest element has a value of C, the second largest has a value of (C/2), the third largest has a value of (C/4), . . . and capacitive element n has a value of $(C/2^{m-1})$. The switches are opened and closed to enable an extremely wide range of capacitance values from $(C/2^{m-1})$ to slightly less than 2C to be achieved, where m is the number of capacitive elements included in each variable capacitor.

Power is normally coupled from rf source 11 to load 12 or calibration circuit 16 via parallel branches 17 or 18. Connections between rf source 11 and one of branches 17 or 18 are established by PIN diodes 21 and 22, respectively. Diodes 21 and 22 are forward biased on a mutually exclusive basis, in response to complementary signals supplied by microprocessor 23 to separate bias control networks for the PIN diodes. PIN diodes 21 and 22 are normally forward biased by a positive DC bias voltage at terminal 24, coupled to the anodes of the PIN diodes by way of low pass filter network 25, including a pair of series inductors and a shunt capacitor connected to a tap between the series inductors. The cathodes of PIN diodes 21 and 22 are selectively connected to ground or a relatively high DC voltage (e.g. 300 volts) at terminal 26 by way of low pass filter networks 27 and 28, respectively; low pass filter networks 27 and 28 are identical to low pass filter network 25. Ground and the voltage at terminal 26 are coupled to the cathodes of PIN diodes 21 and 22 under the control of NPN transistors 31 and 32, each having an emitter collector path in series between DC power supply terminal 26 and ground, as well as load resistors 33 and 34, respectively. Transistors 31 and 32 are forward and reverse biased at mutually exclusive times, a result achieved by coupling a bi-level voltage directly from an output of microprocessor 23 to the base of transistor 32, and via inverter 35 to the base of transistor 31; the base circuits of transistors 31 and 32 are driven by similar bias networks including diodes 36, in series with resistors 37.

The anodes of PIN diodes 21 and 22 are connected in parallel to the 50 ohm output terminal of rf source 11. The cathode of PIN diode 21 is connected to an input terminal of 27 dB attenuator 41, having an output series connected to 180° hybrid 42, while the cathode of PIN diode 22 is connected to one input port of 30 dB directional coupler 43. Hybrid 42 and direction coupler 43 have output ports selectively connected to calibration circuit 16 by double pole, single throw switch 45, having an armature controlled by one output of microprocessor 23. During the initial matching operation, channel 17, including attenuator 41 and hybrid 42, is coupled to rf source 11 by virtue of PIN diode 21 being forward biased. Simultaneously, switch 45 is energized so that the output of hybrid 42 is coupled to calibrating network 16. During normal operation, PIN diode 22 is forward biased, to couple the output of rf source 11 to directional coupler 43 while an output of the directional coupler is connected to calibration circuit 16, by virtue of switch 45 being activated by microprocessor 23 so that the switch is connected to the output of coupler 43, to the exclusion of the output of hybrid 42.

Each of 180° hybrid 42 and 30 dB directional coupler 43 includes two output ports on which are derived rf signals respectively responsive to rf energy from source 11 and rf energy reflected from load 12 or calibration network 16. The levels of the signals derived from hybrid 42 and directional coupler 43 are the same because attenuator 41 and hybrid 42 provide the same attenuation for the rf signal power from source 11 to hybrid 42 as is provided by directional coupler 43 for the rf power coupled by it from source 11 to six port network 46.

The two rf signals derived from hybrid 42 or from directional coupler 43 are selectively coupled to six port network 46 by way of double pole double throw relay 47. The contacts of relay 47 are activated in synchronism with contact 45 in response to an output of microprocessor 23, so that the two output signals of hybrid 42 are coupled to six port network 46 while the output of hybrid 42 is coupled through switch 45 to calibration network 16; the two output signals of directional coupler 43 are coupled to two inputs of six port network 46 by way of relay 47 while the remaining output of coupler 43 is supplied by switch 45 to calibration network 16.

Six port network 46 responds to the two rf input signals supplied to it by way of the contacts of relay 47 to derive four rf output signals $E_3$, $E_4$, $E_5$, and $E_6$. Each of signals $E_3$, $E_5$ and $E_6$ has a variable amplitude and phase, with an amplitude that is a different predetermined function of the rf power of source 11 and the rf power reflected from load 12 and network 13 or calibration network 16 to hybrid 42 or directional coupler 43. The remaining output signal, $E_4$, of six port network 46 is a function solely of the energy derived from rf source 11.

With 27 dB of attenuation provided by attenuator 41 or directional coupler 43 to the rf signals applied to relay 47, the values of the four rf output signals of six port network 46 can be represented as:

$$E_3 = \frac{E_o}{\sqrt{500}} \left[ -\frac{\sqrt{2}}{4} \Gamma \angle \phi + \frac{\sqrt{2}}{4} \angle -90 \right] \quad (1)$$

$$E_4 = \frac{E_o}{\sqrt{500}} \left[ -\frac{\sqrt{2}}{4} \angle -90 \right] \quad (2)$$

$$E_5 = \frac{E_o}{\sqrt{500}} \left[ -\frac{\Gamma}{4} \angle \phi - 90 + \tfrac{1}{4} \angle 0 + \tfrac{1}{4} \angle -90 \right] \quad (3)$$

$$E_6 = \frac{E_o}{\sqrt{500}} \left[ \frac{\Gamma}{4} \angle \phi + \tfrac{1}{4} \angle -90 + \tfrac{1}{4} \angle 0 \right] \quad (4)$$

where $\Gamma \angle \phi$ is the complex reflection coefficient of load 12 or a load provided by calibration network 16, and $E_o$ is the output voltage of rf source 11.

The amplitudes of the four rf signals derived by six port network 46 are determined by identical power detectors 51–54, respectively connected to the four output ports of network 46. Power detectors 51–54 thereby derive four DC voltages; the output voltages of detectors 51, 53 and 54 are different functions of the rf energy of source 11 and the reflected energy from load 12 and matching network 13 or calibrating network 16; the remaining DC voltage derived from power detector 52 is responsive solely to the rf energy from source 11. Because $(1 - 10^{-3})^{\frac{1}{2}}$ is approximately equal to unity, the DC voltage derived from power detectors 51–54 can be respectively represented as:

$$P_3 = \frac{E_o^2}{1000} \left[ \frac{\Gamma^2}{4} + \tfrac{1}{4} + \tfrac{1}{4}\Gamma \sin \phi \right] \quad (5)$$

$$P_4 = \frac{E_o^2}{1000} [\tfrac{1}{4}] \quad (6)$$

$$P_5 = \frac{E_o^2}{1000} \left[ \tfrac{1}{4} + \frac{\Gamma^2}{8} - \tfrac{1}{4}\Gamma \cos \phi - \tfrac{1}{4}\Gamma \sin \phi \right] \quad (7)$$

$$P_6 = \frac{E_o^2}{1000} \left[ \tfrac{1}{4} + \frac{\Gamma^2}{8} - \tfrac{1}{4}\Gamma \sin \phi + \tfrac{1}{4}\Gamma \cos \phi \right] \quad (8)$$

Equations 5–8 can be rewritten as:

$$P_3 = k [\Gamma^2 + 1 + 2\Gamma \sin \phi] \quad (9)$$

$$P_4 = k \quad (10)$$

$$P_5 = k \left[ 1 + \frac{\Gamma^2}{2} - \Gamma \cos \phi - \Gamma \sin \phi \right] \quad (11)$$

$$P_6 = k\left[1 + \frac{\Gamma^2}{2} - \Gamma \sin\phi + \Gamma \cos\phi\right] \quad (12)$$

where k is a predetermined constant, equal in this case to ($E_o^2/4000$).

The DC voltages derived by power detectors 51-54 are supplied to microprocessor 23, which responds to the DC voltages to derive control signals for the values of capacitors 14 and 15 to achieve matching of antenna 12 to source 11. To these ends, microprocessor 23 normalizes the output signals of power detectors 51, 53 and 54 to the output signal of power detector 52 to derive three normalized signals having amplitudes that are different functions of only the complex reflection coefficient to load 12. The three normalized signals derived by microprocessor 23 are represented by:

$$P_3' = \frac{P_3}{P_4} = \Gamma^2 + 1 + 2\Gamma \sin\phi \quad (13)$$

$$P_5' = \frac{P_5}{P_4} = 1 + \frac{\Gamma^2}{2} - \Gamma \cos\phi - \Gamma \sin \quad (14)$$

$$P_6' = \frac{P_6}{P_4} = 1 + \frac{\Gamma^2}{2} - \Gamma \sin\phi + \Gamma \cos\phi \quad (15)$$

The magnitude ($\Gamma$) and phase angle ($\phi$) of the load reflection coefficient are respectively indicated by:

$$\Gamma^2 = \frac{P_3' + P_5' + P_6' - 3}{2} \quad (16)$$

$$\tan\phi = \frac{P_5' + P_6' \cdot P_3' - 1}{2(P_6' - P_5)} \quad (17)$$

Transformation of the normalized real part of the impedance in rectangular coordinates from the complex reflection coefficient in polar coordinates can be made using the following equation:

$$R = \frac{1 - \Gamma^2 \gamma_1}{1 - 2\Gamma \cos\phi + \Gamma^2} \quad (18)$$

In response to a match being achieved between source 11 and its load comprising matching network 13 and antenna 12, R=1 and tan $\phi$=0. By substituting R=1 and tan $\phi$=0, as well as the values of $P_3'$, $P_5'$ and $P_6'$ from Equations (16) and (17) into Equation (18) and from Equation (17), it can be shown that at match:

$$P_3' + 2P_6' = 3 \quad (19),$$

and $$P_5' + P_6' - P_3' = 1 \quad (20).$$

Values of $P_3' + 2P_6'$ in excess of and less than 3 indicate that the real component of load 12 and matching network 13 is respectively greater than and less than the source impedance being matched, i.e., the 50 ohm output impedance of source 11. Values of $P_5' + P_6' - P_3'$ in excess of and less than unity indicate that the reactance of load 12 is respectively positive and negative.

Microprocessor 23 responds to the three normalized magnitudes indicated by Equations (13)-(15) to derive the sum $\Sigma_1 = P_3' + 2P_6'$ and determines if $\Sigma_1$ is equal to, greater than or less than 3 to control shunt capacitive reactance 15. Microprocessor 23 responds to the magnitudes indicated by Equations (13)-(15) to derive the sum $\Sigma_2 = P_5' + P_6' - P_3'$ and determine if $\Sigma_2$ is equal to, greater than or less than 1 to control series capacitive reactance 14.

Initially, microprocessor 23 controls the value of shunt capacitor 15 to transform the impedance of load 12, as seen by source 11 to as near the r=50 ohm circle of the Smith chart of FIG. 3 as possible. This is accomplished by initially short circuiting capacitor 14 and switching the largest capacitive element in shunt capacitor 15 into the circuit, whereby the initial value of capacitor 15 is approximately one half the maximum possible value therefor, i.e., $C_{15o} = C_{15max}/2$. If $P_3' + 2P_6'$ is less than 3, to indicate that the resistive component seen by source 11 is in excess of 50 ohms, the largest capacitive element in shunt capacitor 15 is replaced by the next smallest capacitive element, having a value $C_{15o}/2$. However, in response to $P_3' + 2P_6'$ being less than 3, to indicate that the impedance seen by source 11 is less than 50 ohms, the largest capacitive element remains in the circuit and the effective value of shunt capacitor 15 is increased by $C_{15o}/2$ to $3C_{15o}/2$. The process is iterative, causing the effective impedance seen by the output terminals of source 11 to vary approximately as indicated by trajectory 61, FIG. 3. In an idealized condition, the value of shunt capacitor 15 is varied until $P_3' + 2P_6' = 3$, at which time the real impedance component seen by source 11 equals 50 ohms. In actuality, the value of capacitor 15 is varied until $P_3' + 2P_6'$ is within a predetermined range of 3 and $\phi$ is not negative as indicated by $P_5' + P_6' - P_3'$ having a value at least equal to 1. Then, the value of series capacitor 14 is varied in a similar manner, starting at $C_{15o} = C_{15max}/2$, until $P_5' + P_6' - P_3' = 1$, whereby the impedance seen by the output terminals of source 11 moves approximately along trajectory 62, FIG. 3. Trajectory 62 terminates at the idealized impedance of 50+j0 ohms, at point 63, FIG. 3.

While the components in six port network 46 have a relatively wide band width, they introduce certain variations in the values of output signals $E_3$-$E_6$ from theoretical values for these output signals, as a function of frequency within the band of the frequencies derived by source 11. One particular advantage of the system of the present invention is that these variations as a function of frequency can, to a large extent, be compensated. The compensation process broadly involves determining the values of signals $E_3$-$E_6$ for reflection coefficients of $\Gamma=1$, $\phi=0$ and $\Gamma=0$ for a particular operating frequency of source 11 and comparing the actual measured values of $E_3$-$E_6$ with theoretical values for $E_3$-$E_6$. The comparison compensating coefficients for the values of $E_3$-$E_6$ enable control signals for the values of capacitors 14 and 15 to be derived; the compensating coefficients are stored in the random access memory of microprocessor 23.

The compensating coefficients derived in association with $\Gamma=1$, $\phi=0$ are utilized to control the value of shunt capacitor 15 during on line and initial matching operations, while the compensating coefficients derived for a reflection coefficient of $\Gamma=0$ are utilized to control the value of capacitor 14 during on line and initial matching operations. The calibrating coefficients for $\Gamma=0$ are derived by connecting an impedance matched to the output of source 11 in circuit with switch 45. The calibrating coefficients for $\Gamma=1$, $\phi=0$ are derived by open circuiting or short circuiting the load connected to contact 45; in the present preferred embodiment, the load connected to contact 45 is open circuited.

The first step in calibrating matching network 13 for a particular frequency of source 11 is performed by microprocessor 23 activating transistor 31, switch 45, and relay 47 so that low power branch 17 is in circuit to the exclusion of high power branch 18. Simultaneously, switch 64 is open circuited so that a reflection coefficient of $\Gamma=1$, $\phi=0$ is presented to the output terminals of rf source 11. The four power output signals at this time derived from detectors 51–54 are supplied to microprocessor 23, which normalizes them and compares them with theoretical normalized values of $P_3'=2$, $P_5'=0.5$, $P_6'=2.5$ for a reflection coefficient of $\Gamma=1$, $\phi=0$, as should occur in response to switch 64 being open circuited. The percentage differences between the three actual normalized values and the three theoretical normalized values are determined by microprocessor 23, to derive a first set of compensating coefficients for $P_3'$, $P_5'$ and $P_6'$. While the value of capacitor 15 is being controlled, the first set of compensating coefficients is multiplied by the actual measured, normalized values of $P_3'$, $P_5'$ and $P_6'$, to compensate for the amplitude variations which occur as a function of the frequency of rf source 11.

Then, microprocessor 23 closes switch 64 and energizes switch 66 so that the output of low power branch 17 is coupled to matching network 13, simultaneously with capacitor 14 being short circuited, while setting capacitor 15 at the initial value of $C_{15_o}=C_{15_{max}}/2$. The value of capacitor 15 is then varied, as indicated supra, until $P_3'+2P_6'$ is within a predetermined range of 3 and $P_5'+P_6'-P_3'$ has a value at least equal to one. Thereby, the impedance seen by source 11 varies approximately in accordance with trajectory 61, FIG. 3.

After the above criteria have been satisfied, the system is calibrated for series capacitor 14. To this end, microprocessor 23 activates switch 66 so that the output of low power branch 17 is coupled to matching load impedance 65, in this case a 50 ohm resistive rf load, which causes $\Gamma=0$. The resulting output voltages of power detectors 51–54 are supplied to microprocessor 23, which normalizes them and compares the normalized measured values with theoretical normalized values of $P_3'=P_5'=P_6'=1$. The deviation of the measured normalized values for the particular frequency of source 11 is determined as a percentage of the theoretical normalized values to determine the multiplying coefficients for the outputs of detectors 51–54 during initial adjustment of matching network 13. These calibrating coefficients are multiplied by the normalized output values of power detectors 51–54 while the value of capacitor 14 is controlled during the initial operating mode.

After the low power calibration has been performed, microprocessor 23 activates switch 45 and transistor 32 so that high power branch 18 is connected in circuit to rf calibrating load 65 and six port network 46 is responsive to the output of 30 dB directional coupler 43. Microprocessor 23 again responds to the output signals of power detectors 51–54 to determine the deviation of the measured values of $P_3'$, $P_5'$ and $P_6'$ from the theoretical values thereof to determine calibrating coefficients for the operation of capacitor 14. These high power coefficients are stored in the random access memory of microprocessor 23 in lieu of the low power calibrating coefficients for on-line control of capacitor 14.

With the high power coefficients stored in the random access memory of microprocess 23, the value of capacitor 14 is varied until $P_5'+P_6'-P_3'$ is equal to one or deviates from one by only a predetermined amount.

After the values of capacitors 14 and 15 have been controlled to achieve $\Sigma_1=3$ and $\Sigma_2=1$ to the desired range, microprocessor 23 responds to the four output signals of power detectors 51–54 to compute voltage standing wave ratio (VSWR) from:

$$2\Gamma^2 = P_5' + P_6' - P_3' - 1 \qquad (21)$$

In response to the computed standing wave ratio indicated by Equation (21) being less than a predetermined value, such as 1.7, the computer provides an indication of an acceptable match having been achieved and maintains the values of capacitors 14 and 15 constant. In response to the VSWR exceeding the predetermined value, microprocessor 23 enters an endless loop, signals the operator that a match was not achieved and waits for a prompt from an operator to instigate another calibrating and initial matching operation.

After the calibrating and initial matching operations have been completed, microprocessor 23 activates the system so high power branch 18 is connected by way of switches 45, 64 and 66 to matching network 13, while energizing transistor 32 and relay 47 so six port network 46 is responsive to a pair of rf output signals of directional coupler 43. Each time rf source 11 is activated to supply power to branch 18 in response to an operator activating a press to talk switch (not shown) microprocessor 23 monitors the output voltages of power detectors 51–54 to determine the normalized values $P_3'$, $P_5'$ and $P_6'$. These values are constantly monitored throughout a transmission from source 11, to enable voltage standing wave ratio to be constantly determined in accordance with Equation 21. In response to the voltage standing wave ratio calculated by microprocessor 23 during a normal transmission from source 11 exceeding a predetermined value, such as 5 in which case $2\Gamma^2=0.888$, a signal is derived by the microprocessor to readjust the values of capacitors 14 and 15 in matching network 13.

The matching operation is performed as indicated supra; in particular, capacitor 14 is short circuited and the value of capacitor 15 is adjusted to satisfy the criteria of $P_3'+2P_6'$ being approximately equal to 3 and $P_5'+P_6'-P_3'$ having a value at least equal to 1. Then, with the value of capacitor 15 maintained constant, the value of capacitor 14 is varied until $P_5'+P_6'-P_3'$ is approximately equal to one. In response to the voltage standing wave ratio exceeding the maximum predetermined value, source 11 is effectively disabled by microprocessor 23 while matching network 13 is readjusted.

If, however, the voltage standing wave ratio exceeds an intermediate value, such as 2 in which case $2\Gamma^2=0.222$, but is less than the maximum value (in the example equal to 5) transmission from source 11 is not interrupted to readjust matching network 13. Instead, sensing a voltage standing wave ratio between the intermediate and maximum values causes a flag to be set in the random access memory of microprocessor 23. The flag causes the values of capacitors 14 and 15 to be adjusted in response to the next closure of the press to talk switch, i.e., immediately prior to the next transmission interval from source 11.

In the preferred embodiment, microprocessor 23 includes an INTEL 2920 analog signal processor containing an analog to digital converter, in combination with an INTEL 8085 central processing unit and a memory including an INTEL 2K 8755 read only memory and two INTEL 8155 random access memories. The read only memory is programmed utilizing known techniques to perform the operations indicated supra. A program listing, in ASSEMBLY language, of the program stored in the read only memory to control microprocessor 23 so it performs the previously indicated operations is forwarded, for deposit, to the Patent and Trademark Office simultaneously with the filing of the application on the present invention.

Reference is now made to FIG. 2 of the drawing wherein there is illustrated a circuit diagram for a preferred embodiment of six port network 46, in combination with directional coupler 43, assuming that the contacts of relay 47 are activated to be responsive to the rf signals derived from the two output ports of directional coupler 43. Energy from rf source 11 is coupled to input port 81 of directional coupler 43 thence to output ports 82 and 83, but is isolated from port 84. There is virtually no attenuation of the rf energy from source 11 in propagating from port 81 to 83, but there is a 30 dB attenuation of the rf energy in propagating between ports 81 and 82. Reflected energy from load 12 and matching network 13 is coupled to port 83 of coupler 43 and thence to ports 81 and 84. Energy propagated by load 12 and matching network 13 to port 83 is, however, isolated from port 82. There is a 30 dB loss in coupling the reflected energy from load 12 and matching network 13, as it propagates between ports 83 and 84.

The rf energy from source 11, as coupled to port 82, is supplied to 180° hybrid 85, having one port connected to ground by way of matching resistor 86, having a value equal to the 50 ohm output impedance of source 11. Hybrid 85 has first and second identically phased rf output signals, respectively coupled to input ports of 90° hybrids 86 and 87. The remaining input ports of hybrids 86 and 87 are respectively connected to port 84 and to ground by way of 50 ohm matching resistor 88. Hybrid 86 also includes an input port directly responsive to the reflected energy from antenna 12 and matching network 13, as coupled to port 84. 90° hybrid 89 includes first and second input ports respectively responsive to rf signals at two output ports of hybrids 86 and 87. Both output ports of hybrid 89 are connected to power detectors 53 and 54, while the remaining output ports of hybrids 86 and 87 are connected to power detectors 51 and 52.

In the preferred embodiment, hybrids 85–87, as well as hybrid 89, are commercially available hybrids from Anzac Division of Adams Russell, Burlington, Mass. Each of 90° hybrids 86, 87 and 89 includes ports A, B, C and D. Signals coupled to ports A and B are isolated from each other. The signal at port A is coupled to port D with a −90° phase shift and is coupled to port C without phase shift. The signal at port B is coupled to port D with −90° phase shift and is coupled without phase shift to port D. Because ports A and B of hybrids 86 and 89 are responsive to finite, non-zero rf signals, the signals at ports C and D are the vector sum of the signals at ports A and B, with appropriate phase shift, as indicated supra. The resulting rf voltages $E_3$, $E_4$, $E_5$ and $E_6$, as indicated by Equations (1)–(4), are respectively derived at output port C of hybrid 86, output port D of hybrid 87, output port C of hybrid 89 and output port D of hybrid 89 and supplied to power detectors 51, 52, 53 and 54. As described supra, the amplitudes of these signals are detected and combined in microprocessor 23 to control the values of capacitors 14 and 15 to achieve matching.

While there has been illustrated and described one specific embodiment of the invention, it will be clear that variations in the details of the embodiment specifically illustrated and described may be made without departing from the true spirit and scope of the invention as defined in the appended claims. For example, the reactances of matching network 13 can be inductors, as disclosed in commonly assigned U.S. Pat. No. 3,995,237.

I claim:

1. Apparatus for matching an rf load to an rf source comprising a matching network having series and shunt impedances connected between the source and load, a network for coupling energy between the source and load and for deriving first and second rf signals respectively responsive to rf energy from the source and rf energy reflected from the load, another network responsive to the first and second rf signals for deriving four rf signals, three of said four rf signals having amplitudes that are different functions of the magnitude and phase angle of the reflected energy, as well as of the amplitude of the rf source, the other of said four rf signals having an amplitude that is a function of only the amplitude of the rf source, and means responsive to the amplitudes of the four rf signals for controlling the values of the series and shunt impedances.

2. The apparatus of claim 1 wherein the controlling means includes means for: normalizing the amplitudes of the three rf signals relative to the amplitude of the other rf signal, controlling the value of one of the impedances in accordance with a first predetermined function of two of the normalized rf signal amplitudes, controlling the value of another of the impedances in accordance with a second predetermined function of the three normalized rf signal amplitudes.

3. The apparatus of claim 1 wherein the another network includes means for deriving the four rf signals in accordance with:

$$E_3 = k[-\Gamma\angle\phi + 1\angle-90]$$

$$E_4 = -k\angle-90$$

$$E_5 = \frac{\sqrt{2}}{2} k[-\Gamma\angle\phi - 90 + 1\angle 0 + 1\angle-90]$$

$$E_6 = \frac{\sqrt{2}}{2} k[\Gamma\angle\phi + 1\angle-90 + 1\angle 0]$$

wherein
 $E_3$, $E_4$, $E_5$ and $E_6$ represent the four rf signals;
 k is a predetermined constant;
 $\Gamma$ is the amplitude of the load complex reflection coefficient; and
 $\phi$ is the phase angle of the load complex reflection coefficient.

4. The apparatus of claim 3 wherein the another network includes power divider means responsive to energy from the source, a first 90° hybrid having first and second ports respectively responsive to energy from the power divider means and reflected energy from the source, a second 90° hybrid responsive to energy from the power divider means, and a third 90° hybrid having first and second ports responsive to energy from output ports of the first and second 90° hybrids, the four output signals being derived from an output port of the first 90° hybrid, from an output port of the second 90° hybrid, and from two output ports of the third 90° hybrid.

5. The apparatus of claim 3 or 4 wherein the series and shunt impedances of the matching network include reactances of the same type and the control means responds to rf signals $E_3$–$E_6$ to derive three normalized signals having magnitudes represented by:

$$P_3' = \Gamma^2 + 1 + 2\Gamma \sin \phi$$

$$P_6' = 1 + \frac{\Gamma^2}{2} + \Gamma \cos \phi - \Gamma \sin \phi$$

the control means responding to signals $P_3'$, $P_5'$ and $P_6'$ to vary the value of one of the reactances until $$P_3' + 2P_6' \doteq 3$$

and to vary the value of the other reactance until $$P_5' + P_6' - P_3' \doteq 1.$$

6. The apparatus of claim 1 wherein the series and shunt impedances of the matching network include reactances of the same type, the controlling means including means for: (a) coupling energy between the source and load and for deriving first and second rf signals respectively responsive to rf energy from the source and reflected from the load, (b) varying the value of one of the reactances until a predetermined approximate first relation exists between two of the normalized rf signals amplitudes while maintaining the value of the other reactance constant, and (c) varying the value of the other reactance until a predetermined approximate second relation exists between the three normalized rf signal amplitudes while maintaining the value of the one reactance constant.

7. The apparatus of claim 6 wherein said one and another reactances are respectively shunt and series capacitors.

8. The apparatus of claim 6 or 7 wherein the controlling means includes means for initially setting the impedances at median values for the reactances and for successively changing the values of the reactances until the predetermined approximate first and second relations are reached.

9. The apparatus of claim 1 wherein the controlling means includes means for: (a) coupling energy between the source and load and for deriving first and second rf signals respectively responsive to rf energy from the source and reflected from the load, (b) varying the value of one of the impedances until a predetermined approximate first relation that is a function of the real component of the load complex reflection coefficient exists between the three normalized rf signal amplitudes while maintaining the value of the other reactance constant, and (c) varying the value of the other impedance until a predetermined approximate second relation that is a function of the imaginary component of the load complex reflection coefficient exists between the three normalized rf signal amplitudes while maintaining the value of the one impedance constant.

10. The apparatus of claim 9 wherein said one and another impedances are respectively shunt and series capacitors.

11. The apparatus of claim 9 or 10 wherein the controlling means includes means for initially setting the rf impedances at median values for the impedances and for successively changing the values of the impedances until the predetermined approximate first and second relations are reached.

12. Apparatus for matching an rf load to an rf source comprising a matching network having variable matching impedances connected between the source and load, a network coupled to the load for deriving a first rf signal responsive to rf energy reflected from the load, another network responsive to the first rf signal for deriving plural rf signals, each having an amplitude that is a different function of the magnitude and phase angle of the reflected energy, and means responsive to the amplitudes of the plural rf signals for controlling the values of the variable matching impedances.

13. The apparatus of claim 12 wherein the controlling means responds to the amplitudes of the plural rf signals to determine the magnitude and phase of the load reflection coefficient, and controls the values of the variable matching impedances in response to the determined magnitude and phase of the load reflection coefficient.

14. The apparatus of claim 12 wherein the variable matching impedances include series and shunt impedance controlling means including means for: controlling the value of one of the impedances in accordance with a first predetermined function of the amplitudes of the plural rf signals, controlling the value of another of the impedances in accordance with a second predetermined function of the amplitudes of the plural rf signals.

15. The apparatus of claim 14 wherein the first and second predetermined functions are different functions of only the load complex reflection coefficient.

16. A method of matching an rf load to an rf source with a matching network having series and shunt impedances connected between the source and load, deriving first and second rf signals respectively responsive to rf energy from the source and rf energy reflected from the load, responding to the first and second rf signals to derive four rf signals, three of said four rf signals having amplitudes that are different functions of the magnitude and phase angle of the reflected energy, as well as of the amplitude of the rf source, the other of said four rf signals having an amplitude that is a function of only the amplitude of the rf source, and responding to the amplitudes of the four rf signals to control the values of the series and shunt impedances.

17. The method of claim 16 wherein the impedances are controlled by: normalizing the amplitudes of the three rf signals relative to the amplitude of the other rf signal, controlling the value of one of the impedances in accordance with a first predetermined function of two of the normalized rf signal amplitudes, controlling the value of another of the impedances in accordance with a second predetermined function of the three normalized rf signal amplitudes.

18. The method of claim 16 wherein the four rf signals are derived in accordance with:

$$E_3 = k[-\Gamma \angle \phi + 1 \angle -90]$$

$$E_4 = -k \angle -90$$

$$E_5 = \frac{\sqrt{2}}{2} k[-\Gamma \angle \phi - 90 + 1 \angle 0 + 1 \angle -90]$$

-continued $$E_6 = \frac{\sqrt{2}}{2} k [\Gamma \angle \phi + 1 \angle -90 + 1 \angle 0]$$

where
$E_3$, $E_4$, $E_5$ and $E_6$ represent the four rf signals;
$k$ is a predetermined constant;
$\Gamma$ is the amplitude of the load complex reflection coefficient; and
$\phi$ is the phase angle of the load complex reflection coefficient.

19. The method of claim 16 wherein the control step includes: (a) deriving first and second rf signals respectively responsive to rf energy from the source and reflected from the load, (b) then varying the value of one of the impedances until a predetermined approximate first relation exists between two of the normalized rf signals amplitudes while maintaining the value of the other impedance constant, and then (c) varying the value of the other impedance until a predetermined approximate second relation exists between the three normalized rf signal amplitudes while maintaining the value of the one impedance constant.

20. The method of claim 18 wherein the controlling step includes (a) deriving first and second rf signals respectively responsive to rf energy from the source and reflected from the load, (b) then varying the value of one of the impedances until a predetermined approximate first relation that is a function of a real component of the load complex reflection coefficient exists between two of the normalized rf signal amplitudes while maintaining the value of the other impedance constant, and (c) then varying the value of the other impedance until a predetermined approximate second relation that is a function of the imaginary component of the load complex reflection coefficient exists between the three normalized rf signal amplitudes while maintaining the value of the one impedance constant.

21. The method of claim 18 or 20 wherein the controlling step includes initially setting the impedances at median values for the reactances and then selectively increasing or decreasing the values of the impedances until the predetermined approximate first and second relations are reached.

22. A method of matching an rf load to an rf source with a matching network having variable matching impedances connected between the source and load, comprising deriving a first rf signal in response to rf energy reflected from the load, deriving plural rf signals in response to the first rf signal, each of the plural rf signals having an amplitude that is a different function of the magnitude and phase angle of the reflected energy, and controlling the values of the variable matching impedances in response to the amplitude of the plural rf signals.

23. The method of claim 22 wherein during the controlling step the magnitude and phase angle of the load reflection coefficient are determined from the amplitudes of the plural rf signals and controlling the values of the impedances in response to the determined magnitude and phase of the load reflection coefficient.

24. The method of claim 22 wherein the variable matching impedances include series and shunt impedances and the value of one of the impedances is controlled in accordance with a first predetermined function of the amplitudes of the plural rf signals, and the value of another of the impedances is controlled in accordance with a second predetermined function of the amplitudes of the plural rf signals.

25. The method of claim 24 wherein the first and second predetermined functions are different functions of only the load complex reflection coefficient.

26. A method of matching a load to an rf source with a variable impedance matching network connected between the load and source as well as a network responsive to rf energy of the source reflected from the load for deriving plural rf signals, each having an amplitude that is a different function of the reflected energy, the network having a tendency to derive different amplitude signals for the same functions of the reflected energy as the frequency of the source varies, comprising the steps of loading the source with a predetermined impedance which causes the rf signals to have predetermined theoretical values, monitoring the actual values of the rf signals while the source is loaded by the predetermined impedance, determining correction coefficients for the values of the rf signals from the monitored actual values and theoretical values, then monitoring the values of the rf signals while the load is loading the source, adjusting the values of the monitored rf signals derived while the load is loading the source in accordance with the correction coefficients, and controlling the impedance of the matching network in response to the adjusted values of the monitored rf signals.

27. A method of matching a load to an rf source with a matching network including first and second variable impedances connected between the load and source as well as a network responsive to rf energy of the source reflected from the load for deriving plural rf signals, each having an amplitude that is a different function of the reflected energy, the network having a tendency to derive different amplitude signals for the same functions of the reflected energy as the frequency of the source varies, comprising the steps of sequentially loading the source with predetermined first and second impedances which respectively cause the rf signals to have predetermined first and second sets of theoretical values, monitoring the actual values of the rf signals while the source is loaded by the predetermined impedances, determining first and second sets of correction coefficients for the values of the rf signals from the monitored actual values and theoretical values, then monitoring the values of the rf signals while the load is loading the source for first and second conditions of the first and second impedances, adjusting the values of the monitored rf signals derived while the load is loading the source for the first and second conditions in accordance with the first and second sets of correction coefficients, respectively, and controlling the values of the first and second impedances of the matching network in response to the monitored rf signals for the two conditions as adjusted by the first and second sets of correction coefficients, respectively.

28. The method of claim 27 wherein the first and second predetermined impedances respectively cause reflection coefficients of $\Gamma=1$, $\phi=0$ and $\Gamma=0$, controlling one of the impedances in response to the derived rf signals adjusted by the first set of correction coefficients derived while $\Gamma=1$, $\phi=0$, controlling the other impedance in response to the derived rf signals adjusted by the second set of correction coefficients derived while $\Gamma=0$.

29. The method of claim 27 or 28 wherein the first and second impedances respectively include shunt and series reactances, controlling the shunt reactance while the series reactance is short circuited, and then controlling the series reactance while the shunt reactance is maintained constant.

* * * * *